US007635917B2

United States Patent
(12) United States Patent
Wang et al.

(10) Patent No.: US 7,635,917 B2
(45) Date of Patent: Dec. 22, 2009

(54) THREE-DIMENSIONAL PACKAGE AND METHOD OF MAKING THE SAME

(75) Inventors: Ching-Chun Wang, Kaohsiung (TW); Yen-Yi Wu, Kaohsiung (TW); Sem-Wei Lin, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 220 days.

(21) Appl. No.: 11/928,041

(22) Filed: Oct. 30, 2007

(65) Prior Publication Data

US 2008/0142957 A1 Jun. 19, 2008

(30) Foreign Application Priority Data

Dec. 18, 2006 (TW) .............................. 95147392 A

(51) Int. Cl.
*H01L 23/34* (2006.01)

(52) U.S. Cl. ....................... 257/723; 257/685; 257/777; 257/E25.005; 257/E25.02; 257/E25.026

(58) Field of Classification Search ................. 257/723, 257/777, 790, E25.005, E25.006, E25.021–E25.027, 257/E25.031–E25.032, E23.042, E23.085; 438/6, 28, 66, 67, 107, 109, 406, 455–459
See application file for complete search history.

(56) References Cited

U.S. PATENT DOCUMENTS 7,101,731 B2 * 9/2006 Karnezos .................... 438/107
7,250,677 B1 * 7/2007 Lin ........................... 257/723

* cited by examiner

*Primary Examiner*—Jasmine J Clark
(74) *Attorney, Agent, or Firm*—Volentine & Whitt, P.L.L.C.

(57) ABSTRACT

The present invention relates to a three-dimensional package and method of making the same. The package includes a first substrate, a first chip, a second substrate, a second chip, a spacer, and a first molding compound. The first chip is electrically connected to the first substrate. The second substrate is electrically connected to the first substrate. The second chip is electrically connected to the second substrate. One end of the spacer is attached to the first chip, and the other end of the spacer is attached to the second chip. The first molding compound encapsulates the first substrate, the first chip, the second substrate, the second chip, and the spacer. In the present invention, the adhesion between the spacer and the second chip is enhanced, and the overall thickness of the three-dimensional package is reduced.

13 Claims, 3 Drawing Sheets

THREE-DIMENSIONAL PACKAGE AND METHOD OF MAKING THE SAME

BACKGROUND OF THE INVENTION

1. Field of the Invention

The present invention relates to a package and a method of making the same. More particularly, the present invention relates to a three-dimensional package and a method of making the same.

2. Description of the Related Art

FIG. 1 shows a schematic view of a conventional three-dimensional package. The conventional three-dimensional package 1 includes a first substrate 11, a first chip 12, a plurality of first wires 13, a second substrate 14, a second chip 15, a plurality of second wires 16, a second molding compound 17, a spacer 18, a third chip 19, a plurality of third wires 20, a plurality of fourth wires 21, a first molding compound 22, and a plurality of solder balls 23.

The first substrate 11 has a first surface 111 and a second surface 112. The first chip 12 has a first surface 121 and a second surface 122, and the second surface 122 of the first chip 12 is adhered to the first surface 111 of the first substrate 11. The first wires 13 are used to electrically connect the first surface 121 of the first chip 12 and the first surface 111 of the first substrate 11.

A lower end of the spacer 18 is adhered to the first surface 121 of the first chip 12. The third chip 19 is also adhered to the first surface 121 of the first chip 12. The third wires 20 are used to electrically connect the third chip 19 and the first surface 111 of the first substrate 11, and the third chip 19 is thinner than the spacer 18.

The second substrate 14 has a first surface 141 and a second surface 142. The second chip 15 has a first surface 151 and a second surface 152, and the second surface 152 of the second chip 15 is adhered to the first surface 141 of the second substrate 14. The second wires 16 are used to electrically connect the first surface 151 of the second chip 15 and the first surface 141 of the second substrate 14. The second molding compound 17 encapsulates the second chip 15, the second wires 16, and the first surface 141 of the second substrate 14. The second molding compound 17 has a first surface 171.

The second substrate 14, the second chip 15, the second wires 16, and the second molding compound 17 are assembled to form a package. After the package is finished, it is turned over 180 degrees to be stacked on the spacer 18, so as to make the upper end of the spacer 18 adhere to the first surface 171 of the second molding compound 17. The fourth wires 21 are used to electrically connect the second surface 142 of the second substrate 14 and the first surface 111 of the first substrate 11.

The first molding compound 22 encapsulates the first surface 111 of the first substrate 11, the first chip 12, the first wires 13, the third wires 20, the spacer 18, the second substrate 14, the fourth wires 21, and the second molding compound 17. The solder balls 23 are placed on the second surface 112 of the first substrate 11.

The conventional three-dimensional package 1 has the following defects. The spacer 18 is a dummy die, and the material thereof is silicon. When it is bonded with the second molding compound 17 (the material thereof is glue), because the two materials are different, the adhesion is not strong. When a thermal cycle test (TCT) is performed, the bonding interface between the spacer 18 and the second molding compound 17 may easily split, thus reducing the yield of the product. In addition, the thickness of the second molding compound 17 may increase the overall thickness of the conventional three-dimensional package 1, which is a serious defect for a package that aims to be "light, thin, short, and small".

Therefore, it is necessary to provide a three-dimensional package and a method of making the same to solve the above problems.

SUMMARY OF THE INVENTION

The object of the present invention is to provide a three-dimensional package, which includes a first substrate, a first chip, a second substrate, a second chip, a spacer, and a first molding compound. The first substrate has a first surface and a second surface. The first chip has a first surface and a second surface, and the first chip is electrically connected to the first substrate. The second substrate has a first surface and a second surface, and the second surface of the second substrate is electrically connected to the first surface of the first substrate. The second chip has a first surface and a second surface, and the second chip is electrically connected to the second substrate. One end of the spacer is attached to the first surface of the first chip, and the other end is attached to the first surface of the second chip. The first molding compound encapsulates the first surface of the first substrate, the first chip, the spacer, the second substrate, and the second chip.

Another object of the present invention is to provide a method of making the three-dimensional package, which includes:

(a) providing a first substrate having a first surface and a second surface;

(b) providing a first chip having a first surface and a second surface;

(c) electrically connecting the first chip to the first substrate;

(d) providing a second substrate having a first surface and a second surface;

(e) providing a second chip having a first surface and a second surface;

(f) electrically connecting the second chip to the second substrate;

(g) attaching a spacer to the first surface of the first chip;

(h) turning over the second substrate and the second chip, and adhering the first surface of the second chip to the spacer;

(i) electrically connecting the second surface of the second substrate to the first surface of the first substrate; and (j) encapsulating the first surface of the first substrate, the first chip, the second substrate, and the second chip with a first molding compound.

In the present invention, the material of the spacer is silicon, and the material of the second chip is also silicon, so the adhesion between the two is relatively strong. When the TCT is performed, the bonding interface between the spacer and the second chip will not easily split. In addition, the second molding compound is not provided between the spacer and the second chip, so the three-dimensional package of the present invention is thinner than a conventional three-dimensional package.

DETAILED DESCRIPTION OF THE INVENTION

Figure 1:
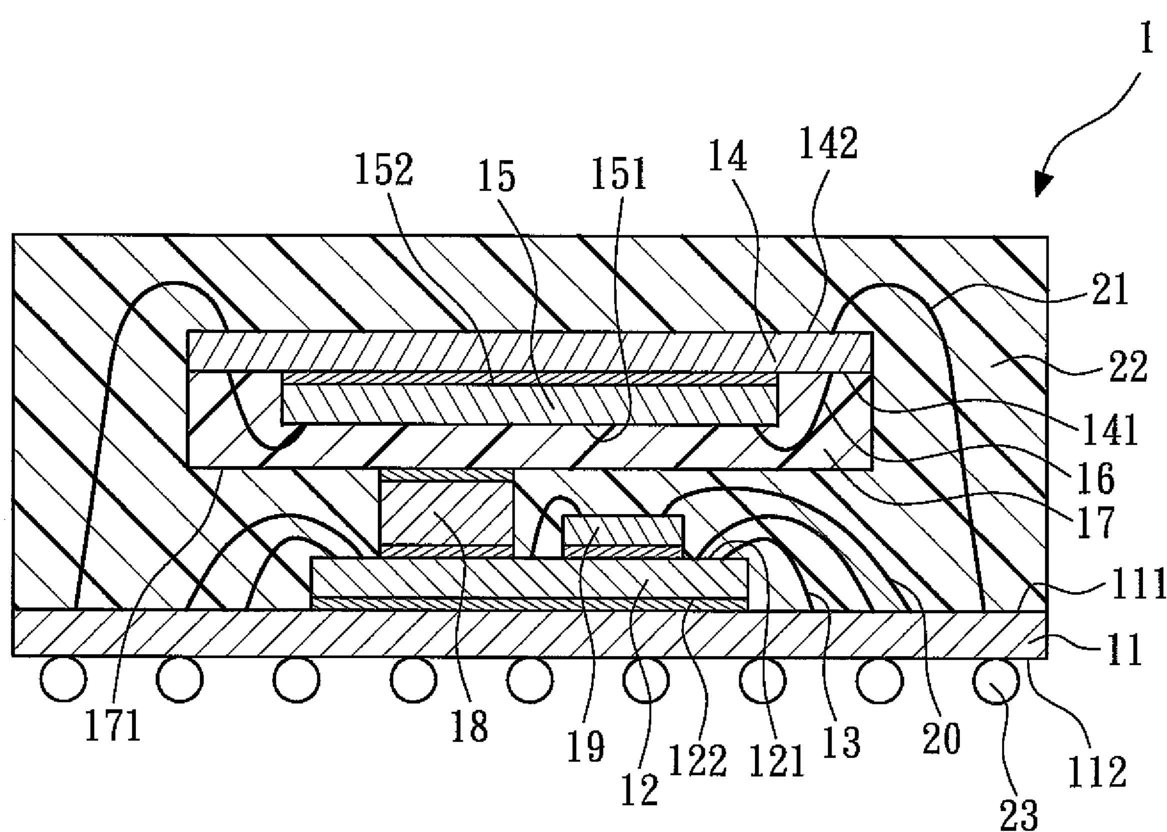
FIG. 1 is a schematic view of a conventional three-dimensional package.
Figure 2:
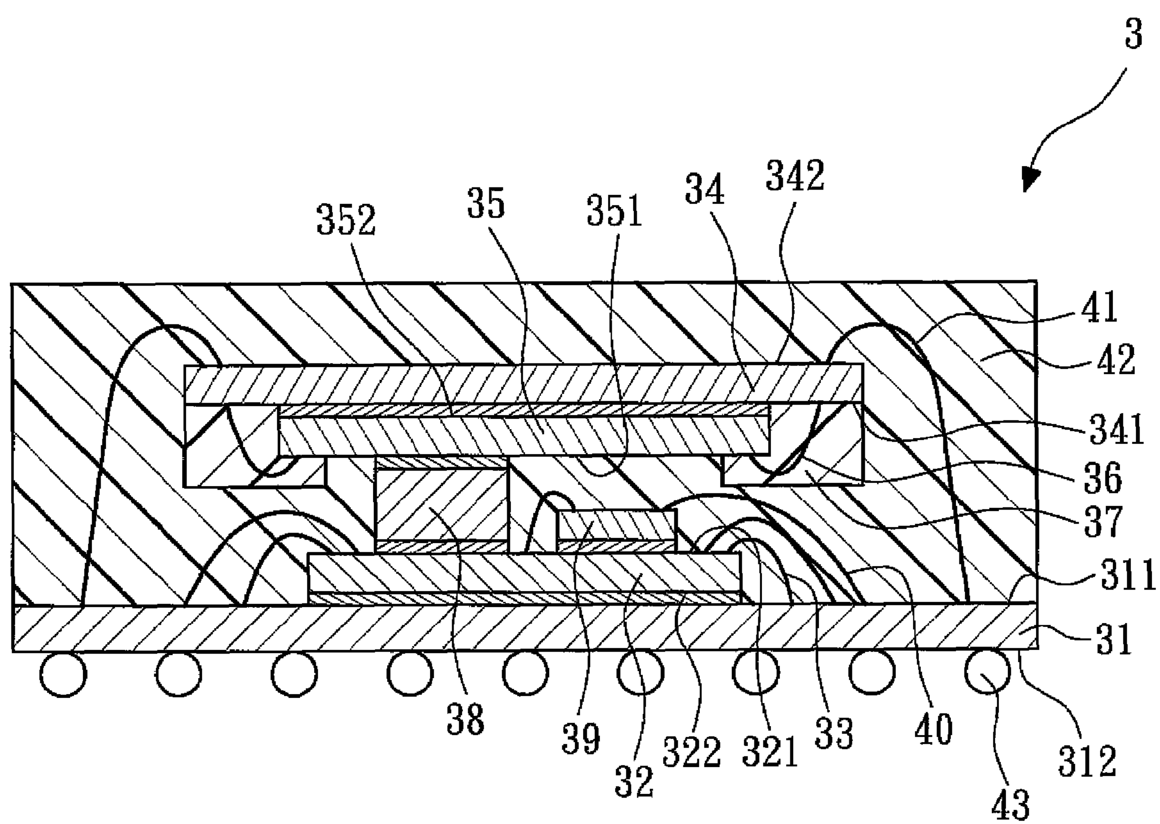
FIG. 2 is a schematic view of a three-dimensional package of the present invention.

FIG. 2 shows a schematic view of a three-dimensional package of the present invention. The three-dimensional package 3 includes a first substrate 31, a first chip 32, a plurality of first wires 33, a second substrate 34, a second chip 35, a plurality of second wires 36, a second molding compound 37, a spacer 38, a third chip 39, a plurality of third wires 40, a plurality of fourth wires 41, a first molding compound 42, and a plurality of solder balls 43.

The first substrate 31 has a first surface 311 and a second surface 312. The first chip 32 has a first surface 321 and a second surface 322, and the first chip 32 is electrically connected to the first substrate 32. In this embodiment, the second surface 322 of the first chip 32 is attached to the first surface 311 of the first substrate 31. However, in other applications, other elements (for example, another chip) may be added between the first chip 32 and the first substrate 31. In this embodiment, the first surface 321 is active surface, and the second surface 322 is backside surface. Thus, the second surface 322 of the first chip 32 is directly adhered to the first surface 311 of the first substrate 31, and the first wires 33 are used to electrically connect the first surface 321 of the first chip 32 and the first surface 311 of the first substrate 31. However, in other application, the first surface 321 is backside surface, and the second surface 322 is active surface. Thus, the second surface 322 of the first chip 32 is electrically connected to the first surface 311 of the first substrate 31 in the manner of a flip chip.

The lower end of the spacer 38 is adhered to the first surface 321 of the first chip 32. In this embodiment, the spacer 38 is a dummy die, and the material thereof is silicon. Preferably, the three-dimensional package 3 further includes a third chip 39 adhered to the first surface 321 of the first chip 32. The third wires 40 are used to electrically connect the third chip 39 and the first surface 311 of the first substrate 31, and the third chip 39 is thinner than the spacer 38. Preferably, the third chip 39 can also be electrically connected to the first surface 321 of the first chip 32.

The second substrate 34 has a first surface 341 and a second surface 342. The second chip 35 has a first surface 351 and a second surface 352, and the second chip 35 is electrically connected to the second substrate 34. In this embodiment, the second surface 352 of the second chip 35 is attached to the first surface 341 of the second substrate 34. However, in other applications, other elements (for example, another chip) may be added between the second chip 35 and the second substrate 34. In this embodiment, the first surface 351 is active surface, and the second surface 352 is backside surface. Thus, the second surface 352 of the second chip 35 is directly adhered to the first surface 341 of the second substrate 34, and the second wires 36 are used to electrically connect the first surface 351 of the second chip 35 and the first surface 341 of the second substrate 34. However, in other application, the first surface 351 is backside surface, and the second surface 352 is active surface. Thus, the second surface 352 of the second chip 35 is electrically connected to the first surface 341 of the second substrate 34 in the manner of a flip chip. The second molding compound 37 encapsulates a part of the second chip 35, the second wire 36, and the first surface 341 of the second substrate 34, and exposes a part of the first surface 351 of the second chip 35, that is, the second molding compound 37 does not totally cover the first surface 351 of the second chip 35.

The second substrate 34, the second chip 35, the second wires 36, and the second molding compound 37 are assembled to form a package. After the package is finished, it is turned over 180 degrees to be stacked on the spacer 38, so as to make the upper end of the spacer 38 adhere to the first surface 351 of the second chip 35. The fourth wires 41 are used to electrically connect the second surface 342 of the second substrate 34 and the first surface 311 of the first substrate 31.

The first molding compound 42 encapsulates the first surface 311 of the first substrate 31, the first chip 32, the first wires 33, the third wires 40, the spacer 38, the second substrate 34, the second chip 35, the fourth wires 41, and the second molding compound 37. The solder balls 43 are located on the second surface 312 of the first substrate 31.

Figure 3:
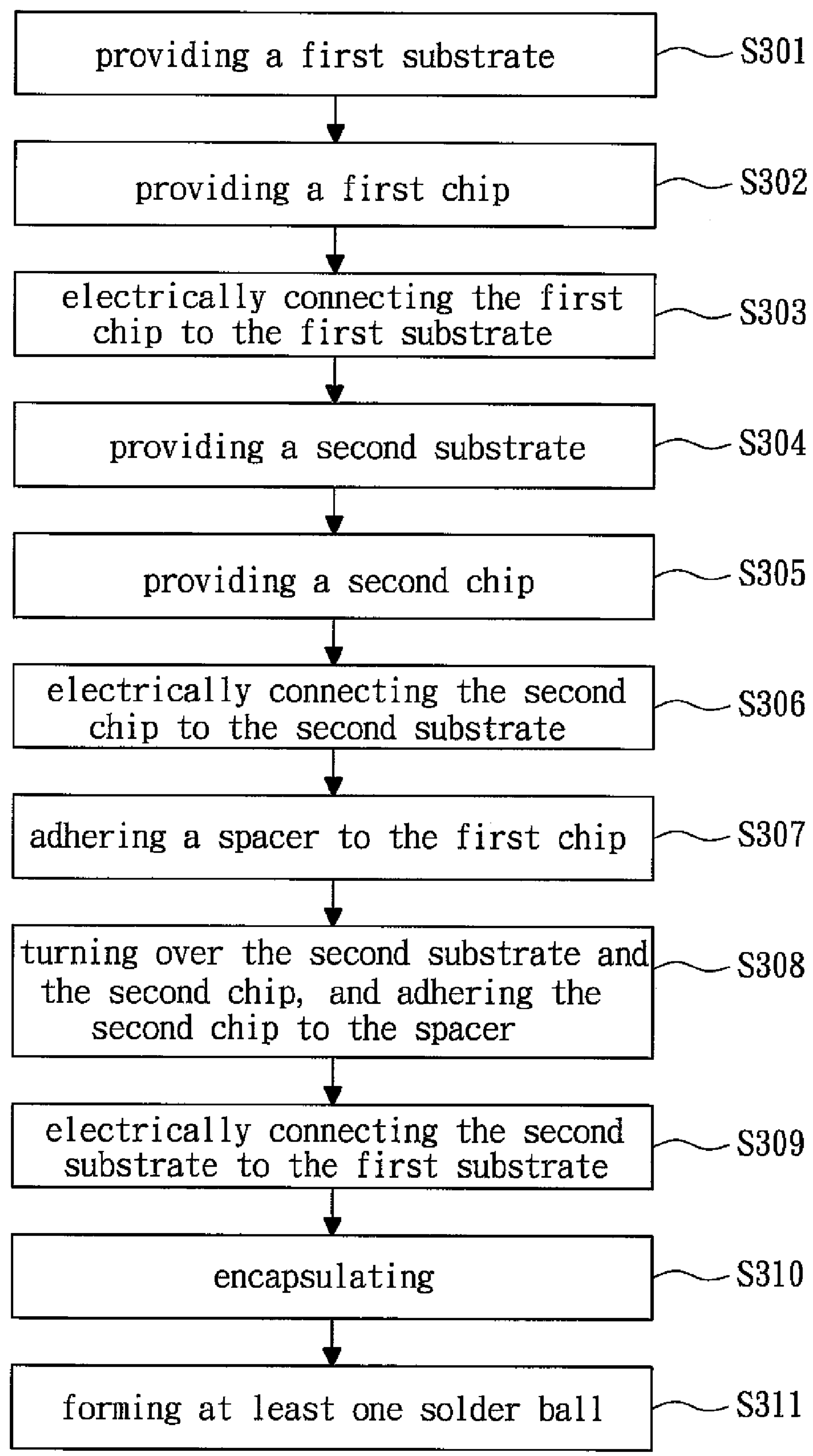
FIG. 3 is a schematic view of a manufacturing flow of the three-dimensional package of the present invention.

FIG. 3 shows a schematic view of a manufacturing flow of the three-dimensional package of the present invention. Together with FIG. 2, the manufacturing method includes the following steps. In step S301, a first substrate 31 having a first surface 311 and a second surface 312 is provided. In step S302, a first chip 32 having a first surface 321 and a second surface 322 is provided. In step S303, the first chip 32 is electrically connected to the first substrate 31. In this step of this embodiment, the first surface 321 is active surface, and the second surface 322 is backside surface. Thus, the second surface 322 of the first chip 32 is adhered to the first surface 311 of the first substrate 31, and a plurality of first wires 33 are used to electrically connect the first surface 321 of the first chip 32 and the first surface 311 of the first substrate 31. However, in other applications, in this step, the first surface 321 is backside surface, and the second surface 322 is active surface. Thus, the second surface 322 of the first chip 32 is electrically connected to the first surface 311 of the first substrate 31 in the manner of a flip chip.

In step S304, a second substrate 34 having a first surface 341 and a second surface 342 is provided, and here, the first surface 341 of the second substrate 34 is the upper surface. In step S305, a second chip 35 having a first surface 351 and a second surface 352 is provided, and here, the first surface 351 of the second chip 35 is the upper surface. In step S306, the second chip 35 is electrically connected to the second substrate 34. In this step of this embodiment, the first surface 351 is active surface, and the second surface 352 is backside surface. Thus, the second surface 352 of the second chip 35 is adhered to the first surface 341 of the second substrate 34, and a plurality of second wires 36 are used to electrically connect the first surface 351 of the second chip 35 and the first surface 341 of the second substrate 34. However, in other applications, in this step, the first surface 351 is backside surface, and the second surface 352 is active surface. Thus, the second surface 352 of the second chip 35 is electrically connected to the first surface 341 of the second substrate 34 in the manner of a flip chip. Thereafter, a second molding compound 37 is used to encapsulate the second wires 36 and expose a part of the first surface 351 of the second chip 35. The second substrate 34, the second chip 35, the second wires 36, and the second molding compound 37 are assembled to form a package.

In step S307, a spacer 38 is adhered to the first surface 321 of the first chip 32. Preferably, after this step, the method further includes a step of adhering a third chip 39 to the first surface 321 of the first chip 32. A plurality of third wires 40 are used to electrically connect to the third chip 39 and the first substrate 31, and the third chip 39 is thinner than the spacer 38. In step S308, the package formed by the second substrate 34 and the second chip 35 is turned over, and the first surface 351 of the second chip 35 is adhered on the spacer 38.

At this time, the first surface 341 of the second substrate 34 and the first surface 351 of the second chip 35 are lower surfaces.

In step S309, the second surface 342 of the second substrate 34 is electrically connected to the first surface 311 of the first substrate 31. In this embodiment, a plurality of fourth wires 41 is used to electrically connect the second surface 342 of the second substrate 34 and the first surface 311 of the first substrate 31. In step S310, a first molding compound 42 is used to encapsulate the first surface 311 of the first substrate 31, the first chip 32, the second substrate 34, and the second chip 35. In step S311, at least one solder ball 43 is formed on the second surface 312 of the first substrate 31. Finally, the three-dimensional package 3 is fabricated.

In the present invention, the material of the spacer 38 is silicon, and the material of the second chip 35 is also silicon, so the adhesion is relatively strong. When the Thermal Cycle Test (TCT) is performed, the bonding interface between the spacer 38 and the second chip 35 will not easily split. In addition, the second molding compound 37 is not provided between the spacer 38 and the second chip 35, so the three-dimensional package 3 is thinner than the conventional three-dimensional package 1.

While several embodiments of the present invention have been illustrated and described, various modifications and improvements can be made by those skilled in the art. The embodiments of the present invention are therefore described in an illustrative but not restrictive sense. It is intended that the present invention should not be limited to the particular forms illustrated, and that all modifications which maintain the spirit and scope of the present invention are within the scope defined in the appended claims.

What is claimed is:

1. A three-dimensional package, comprising:

a first substrate, having a first surface and a second surface;

a first chip, having a first surface and a second surface, the first chip electrically connected to the first substrate;

a second substrate, having a first surface and a second surface, the second surface of the second substrate electrically connected to the first surface of the first substrate;

a second chip, having a first surface and a second surface, the second chip electrically connected to the second substrate;

a spacer, having an end attached to the first surface of the first chip and the other end attached to the first surface of the second chip; and a first molding compound, encapsulating the first surface of the first substrate, the first chip, the spacer, the second substrate, and the second chip.

2. The three-dimensional package as claimed in claim 1, wherein the second surface of the first chip is attached to the first surface of the first substrate.

3. The three-dimensional package as claimed in claim 2, wherein the second surface of the first chip is adhered to the first surface of the first substrate.

4. The three-dimensional package as claimed in claim 3, further comprising a plurality of first wires for electrically connecting the first surface of the first chip and the first surface of the first substrate.

5. The three-dimensional package as claimed in claim 1, further comprising a third chip adhered to the first surface of the first chip, wherein the third chip is electrically connected to the first substrate, and the third chip is thinner than the spacer.

6. The three-dimensional package as claimed in claim 5, further comprising a plurality of third wires for electrically connecting the third chip and the first surface of the first substrate.

7. The three-dimensional package as claimed in claim 1, wherein the second surface of the second chip is attached to the first surface of the second substrate.

8. The three-dimensional package as claimed in claim 7, wherein the second surface of the second chip is adhered to the first surface of the second substrate.

9. The three-dimensional package as claimed in claim 8, further comprising a plurality of second wires for electrically connecting the first surface of the second chip and the first surface of the second substrate.

10. The three-dimensional package as claimed in claim 9, further comprising a second molding compound for encapsulating the second wires and exposing a part of the first surface of the second chip.

11. The three-dimensional package as claimed in claim 1, further comprising a plurality of fourth wires for electrically connecting the second surface of the second substrate and the first surface of the first substrate.

12. The three-dimensional package as claimed in claim 1, further comprising a plurality of solder balls located on the second surface of the first substrate.

13. The three-dimensional package as claimed in claim 1, wherein the spacer is a dummy die, and a material thereof is silicon.

* * * * *